(12) United States Patent
Kobayashi

(10) Patent No.: US 11,575,842 B2
(45) Date of Patent: Feb. 7, 2023

(54) IMAGING APPARATUS

(71) Applicant: CANON KABUSHIKI KAISHA, Tokyo (JP)

(72) Inventor: Hideo Kobayashi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/525,733

(22) Filed: Jul. 30, 2019

(65) Prior Publication Data

US 2020/0045220 A1    Feb. 6, 2020

(30) Foreign Application Priority Data

Aug. 3, 2018    (JP) .............................. JP2018-147010

(51) Int. Cl.
*H04N 5/235* (2006.01)
*H01L 27/146* (2006.01)

(52) U.S. Cl.
CPC ..... *H04N 5/2355* (2013.01); *H01L 27/14634* (2013.01)

(58) Field of Classification Search
CPC .... H04N 5/2355; H04N 5/378; H04N 5/3765; H04N 5/35554; H01L 27/14634
See application file for complete search history.

(56) References Cited

U.S. PATENT DOCUMENTS

| | | | |
|---|---|---|---|
| 6,031,964 A * | 2/2000 | Anderson | H04N 1/00204 348/231.2 |
| 9,609,213 B2 | 3/2017 | Wakabayashi | |
| 9,848,147 B2 | 12/2017 | Wakabayashi | |
| 10,375,309 B2 | 8/2019 | Wakabayashi | |
| 2014/0232929 A1 | 8/2014 | Ichikawa | |
| 2015/0163403 A1 | 6/2015 | Wakabayashi | |

(Continued)

FOREIGN PATENT DOCUMENTS

| | | |
|---|---|---|
| JP | 2009-267739 A | 11/2009 |
| JP | 2014-057189 A | 3/2014 |

(Continued)

OTHER PUBLICATIONS

MacRumors—What Does Keep Normal Photo Switch Do?, Oct. 2014, retrieved from https://forums.macrumors.com/threads/what-does-keep-normal-photo-switch-do.1796588/ on Aug. 12, 2020 (Year: 2014).*

*Primary Examiner* — Timothy J Henn
(74) *Attorney, Agent, or Firm* — Venable LLP

(57) ABSTRACT

An imaging apparatus, comprising: a signal processing unit reads pixel signals from a plurality of pixel circuits during a predetermined time, and stores at least first image data corresponding to a first frame which corresponds to a first exposure time, second image data corresponding to a second frame which corresponds to a second exposure time that is different from the first exposure time, and third image data corresponding to a third frame which corresponds to a third exposure time that is different from the second exposure time, a computing unit generates a first image using the image data corresponding to the first frame and third frame, and generates a second image using the image data corresponding to the second frame, wherein the exposure for the second frame is performed between the exposure for the first frame and the exposure for the third frame.

22 Claims, 13 Drawing Sheets

(56) References Cited

U.S. PATENT DOCUMENTS

| | | | |
|---|---|---|---|
| 2015/0237247 A1 | 8/2015 | Hara | |
| 2015/0350583 A1* | 12/2015 | Mauritzson | H04N 9/04557 |
| | | | 250/208.1 |
| 2016/0037043 A1* | 2/2016 | Wang | H04N 5/35581 |
| | | | 382/275 |
| 2016/0182839 A1 | 6/2016 | Shigeta et al. | |
| 2016/0373629 A1* | 12/2016 | Jung | H04N 5/2254 |
| 2017/0171482 A1 | 6/2017 | Wakabayashi | |
| 2017/0187970 A1* | 6/2017 | Zhou | H04N 5/35554 |
| 2017/0353679 A1 | 12/2017 | Negishi | |
| 2018/0084212 A1 | 3/2018 | Wakabayashi | |
| 2018/0115724 A1 | 4/2018 | Motonaga | |
| 2018/0220054 A1* | 8/2018 | Swami | G06T 5/50 |
| 2018/0278824 A1* | 9/2018 | Somasundaram | H04N 5/2356 |
| 2018/0302544 A1* | 10/2018 | Dhiman | G06T 7/246 |
| 2019/0075263 A1* | 3/2019 | Mlinar | H04N 1/64 |

FOREIGN PATENT DOCUMENTS

| | | |
|---|---|---|
| JP | 2017-112420 A | 6/2017 |
| WO | 2014/007004 A1 | 1/2014 |
| WO | 2017/169233 A1 | 10/2017 |
| WO | 2018/012051 A1 | 1/2018 |

* cited by examiner

IMAGING APPARATUS

BACKGROUND OF THE INVENTION

Field of the Invention

The present invention relates to an imaging apparatus.

Description of the Related Art

In an imaging apparatus to acquire an image, a technique of image composition using a plurality of images is available. For example, International Publication No. 2014/007004 discloses an imaging apparatus that combines a long exposure time image and a short exposure time image which are exposed for mutually different exposure times using a frame memory, so as to expand the dynamic range.

However, the long exposure time image and the short exposure time image that are combined according to International Publication No. 2014/007004 are acquired at different timings. Therefore the deviation of these timings may drop simultaneity among the plurality of images, which results in image deterioration. For example, when two images are combined, the combined image may deteriorate in the case where the object moves between the exposure timing for the first image and the exposure timing of the second image.

SUMMARY OF THE INVENTION

The technology of the present disclosure can employ the following configurations. That is an imaging apparatus, comprising:
 a plurality of pixel circuits;
 a memory;
 a signal processing unit configured to generate image data based on pixel signals read from the plurality of pixel circuits and store the image data in the memory; and
 a computing unit configured to generate an image based on the image data,
 wherein the signal processing unit reads pixel signals from the plurality of pixel circuits during a predetermined time, and stores the pixel signals in the memory as image data corresponding to one frame, and
 wherein the signal processing unit stores at least (1) image data corresponding to a first frame which corresponds to a first exposure time, (2) image data corresponding to a second frame which corresponds to a second exposure time that is different from the first exposure time, and (3) image data corresponding to a third frame which corresponds to a third exposure time that is different from the second exposure time,
 wherein the exposure for the second frame is performed between the exposure for the first frame and the exposure for the third frame,
 wherein the computing unit generates a first image using the image data corresponding to the first frame and third frame stored in the memory, and generates a second image using the image data corresponding to the second frame stored in the memory.

The technology of the present disclosure can employ the following configurations. That is an imaging apparatus, comprising:
 a plurality of pixel circuits;
 a memory configured to include a first memory and a second memory;
 a signal processing unit configured to acquire image data based on charges stored in the plurality of pixel circuits and store the image data in the memory;
 a selecting unit configured to select one of the first memory and the second memory to store the image data; and
 a computing unit configured to generate an image based on the image data,
 wherein the signal processing unit reads pixel signals from the plurality of pixel circuits during a predetermined time, and stores the pixel signals in the first memory as image data corresponding to one frame, and
 wherein the signal processing unit stores at least (1) image data corresponding to a first frame which corresponds to a first exposure time and (2) image data corresponding to a second frame which corresponds to a second exposure time,
 wherein the time required for the signal processing unit to store the image data corresponding to the one frame is shorter than the time required for the computing unit to read the image data corresponding to the one frame.

Further features of the present invention will become apparent from the following description of exemplary embodiments with reference to the attached drawings.

DESCRIPTION OF THE EMBODIMENTS

It is an object of the technique of the invention to improve image quality when an imaging apparatus combines an image using a plurality of images.

Preferred embodiments of the invention will be described with reference to the drawings. Dimensions, materials, shapes and relative positions of the composing elements described herein below may be appropriately changed depending on the configuration and various conditions of the apparatus to which the invention is applied. Therefore the following description does not limit the scope of the invention.

Example 1

Figure 1:
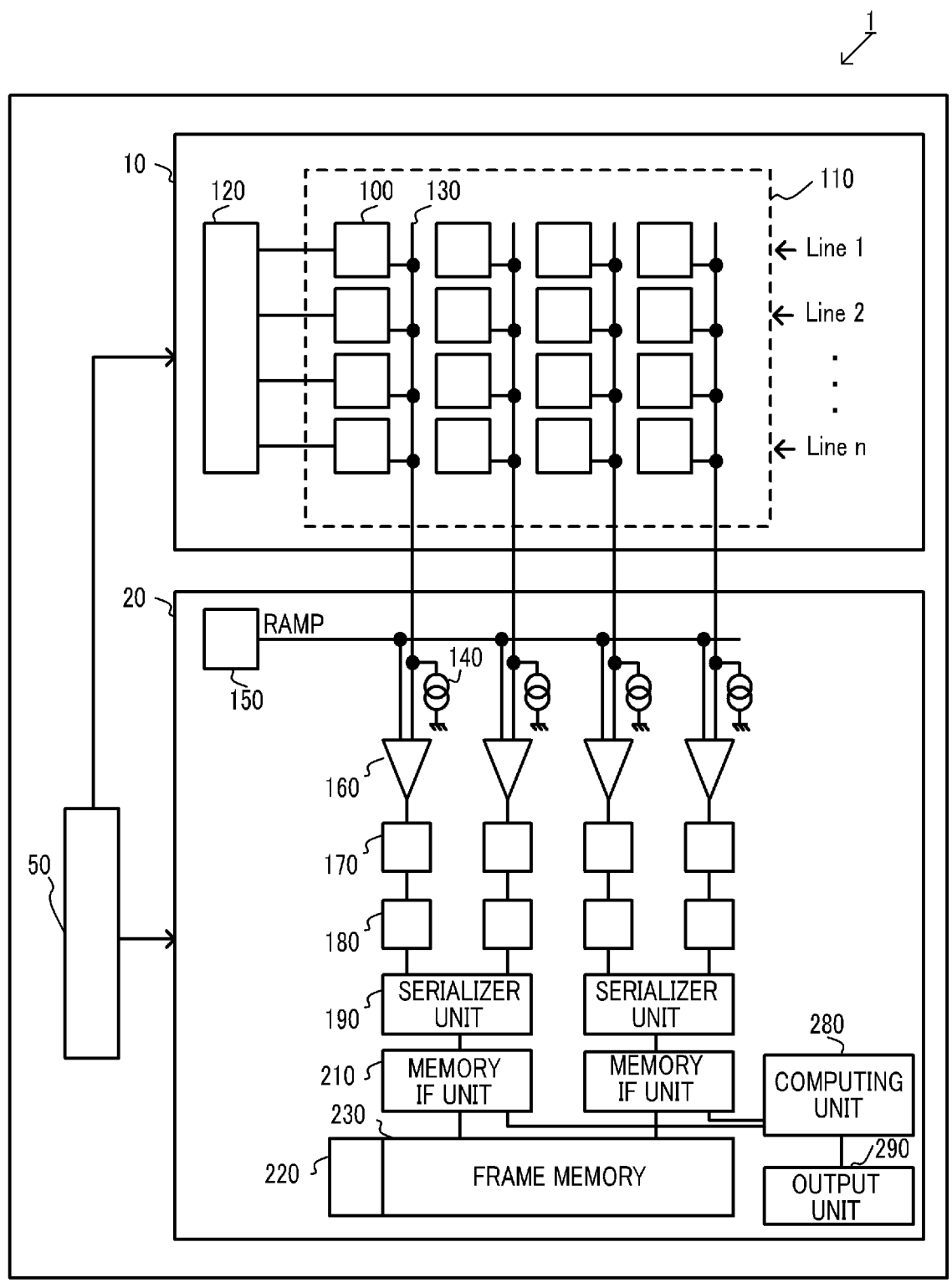
FIG. 1 is a schematic diagram depicting an imaging apparatus according to Example 1.

Apparatus Configuration
FIG. 1 is a schematic diagram depicting an imaging apparatus 1 according to Example 1. The imaging apparatus 1 is constituted of a photoelectric conversion chip 10 and a signal processing chip 20. The photoelectric conversion chip 10 includes a pixel array 110, a vertical scanning circuit 120 and a signal line 130. The pixel array 110 is constituted by a plurality of pixel circuits 100 disposed in a matrix, each of which includes at least one photoelectric conversion element, and in this example, there are n number of rows of pixel circuits 100 (row 1, 2, . . . , n). In the photoelectric conversion chip 10, at least the photoacoustic conversion elements of the pixel circuits 100 are disposed, and the semiconductors elements, other than then photoelectric conversion elements in each pixel circuit 100, may be disposed in a different chip. The signal processing chip 20 includes a current source 140, a lamp generator 150, a comparator 160, a counter 170, a latch unit 180, a serializer unit 190, a memory IF unit 210, a row decoder 220, a frame memory 230, a computing unit 280 and an output unit 290.

The photoelectric conversion chip 10 and the signal processing chip 20 may be superimposed onto each other so that the imaging apparatus 1 has a chip-layered structure. In this case, the photoelectric conversion chip 10 may be called a first chip and the signal processing chip 20 may be called a second chip. In the imaging apparatus 1 having a chip-layered structure, the photoelectric conversion chip 10 and the signal processing chip 20 may be connected by various methods. For example, the photoelectric conversion chip 10 and the signal processing chip 20 may be connected by wire bonding connection, flip chip connection, connection by through-silicon via (TSV) which penetrates through the semiconductor layer, or connection by inter-chip wiring based on direct bonding of metal layer of each chip. These connection methods may be combined. Further, the frame memory 230 may be disposed on a memory chip that is different from the signal processing chip 20. The memory chip and the photoelectric conversion chip 10 and/or the signal processing chip 20 may be superimposed onto each other. The imaging apparatus 1, constituted of the photoelectric conversion chip 10, the signal processing chip 20 and the memory chip which are stacked in three layers, may be used. This chip may be called a third chip.

Each chip includes a semiconductor layer on which a photoelectric conversion element (e.g. photodiode) and/or a semiconductor element (e.g. transistor) are disposed. Therefore in the case where the imaging apparatus 1 has a chip-layered structure, the semiconductor layer on which the photoelectric conversion element is disposed, and the semiconductor layer on which the semiconductor element, included in the serializer unit 190 or the frame memory 230, is disposed, are stacked in layers. The above mentioned chip-layered structure can be manufactured by forming a layered body of a wafer for the photoelectric conversion chip 10 and a wafer for the signal processing chip 20, and dicing this layered body. The chip-layered structure may also be manufactured by stacking the photoelectric conversion chip 10, which is manufactured by dicing a wafer for the photoelectric conversion chip 10, and the signal processing chip 20, which is manufactured by dicing a wafer for the signal processing chip 20 in layers. Therefore the first chip may be called the first semiconductor layer, the second chip may be called the second semiconductor layer, and the third chip may be called the third semiconductor layer.

The frame memory 230 is a memory in which image data corresponding to at least one frame is stored. The frame memory 230 may be constituted of an array of memory cells, such as DRAMs or SRAMs. It is preferable to dispose the frame memory 230 constituted of SRAMs on the signal processing chip 20, and superimpose the signal processing chip 20 onto the photoelectric conversion chip 10. It is also preferable to dispose the frame memory 230 constituted of DRAMs on a memory chip that are different from the signal processing chip 20, and superimpose this memory chip onto the signal processing chip 20. In this way, the arrangement of each composing element of the image apparatus 1 in FIG. 3, especially the composing elements included in the signal processing chip 20, is arbitrary, as long as the processing required for this embodiment can be implemented. In the example in FIG. 3, a portion of the signal processing chip, configured to store the image data in the frame memory 230, corresponds to the signal processing unit, and the computing unit corresponds to the computing unit.

Figure 11:
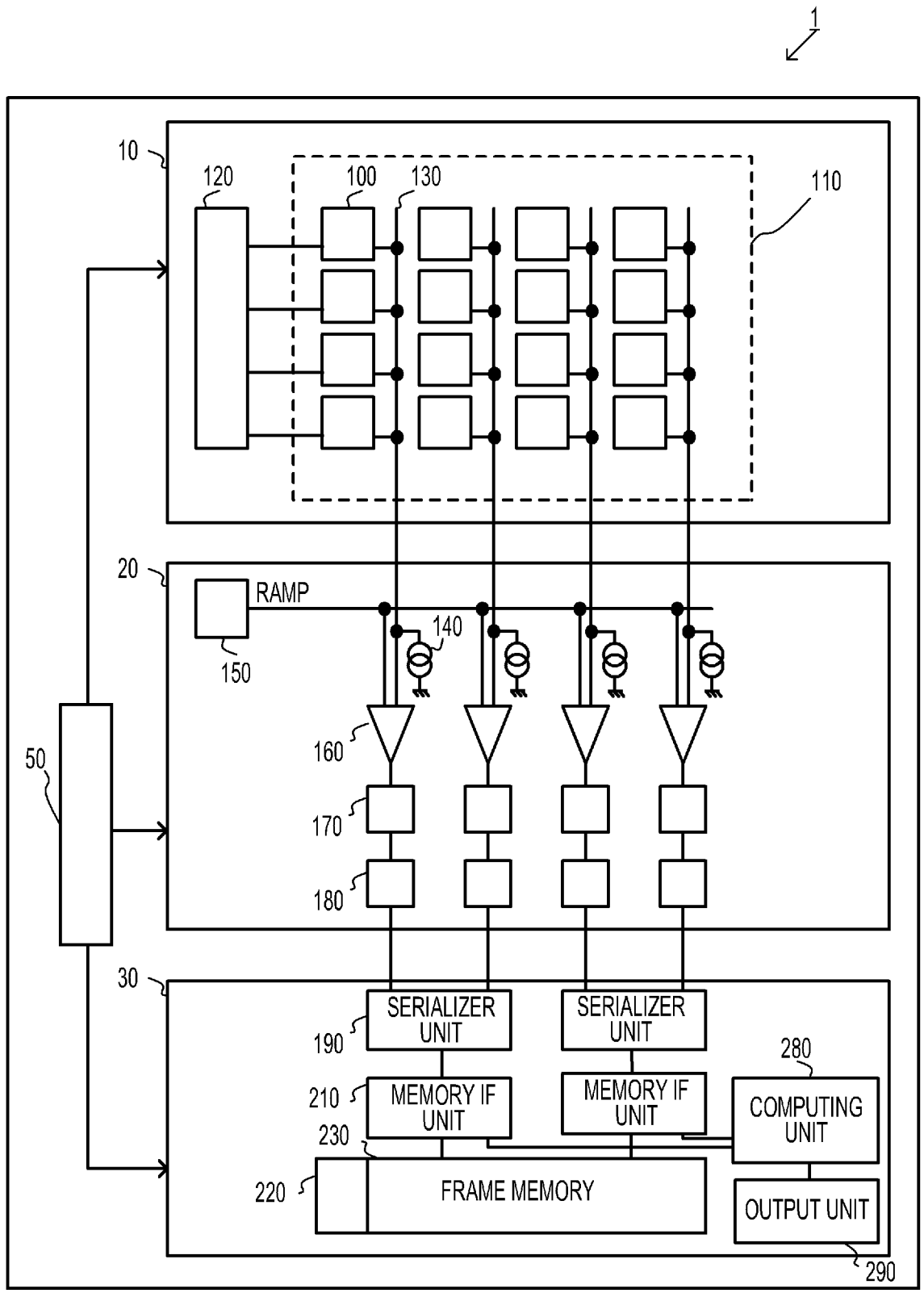
FIG. 11 is a schematic diagram depicting another example of the imaging apparatus.

A timing generator 50 outputs various signal to instruct each timing. The timing generator 50 may supply a timing signal from outside the imaging apparatus 1. As mentioned later, the chip arrangement and the circuit configuration are not limited to FIG. 1 if the processing of the embodiment can be implemented. For example, as illustrated in FIG. 11, the chip configuration may be changed. The processing may be performed by collaboration between the photoelectric conversion chip 10 and an external circuit. For example, in the case of applying the imaging apparatus to a camera, the processing of this embodiment may be implemented by collaboration between the imaging apparatus and an imaging processing apparatus of the camera.

Figure 2:
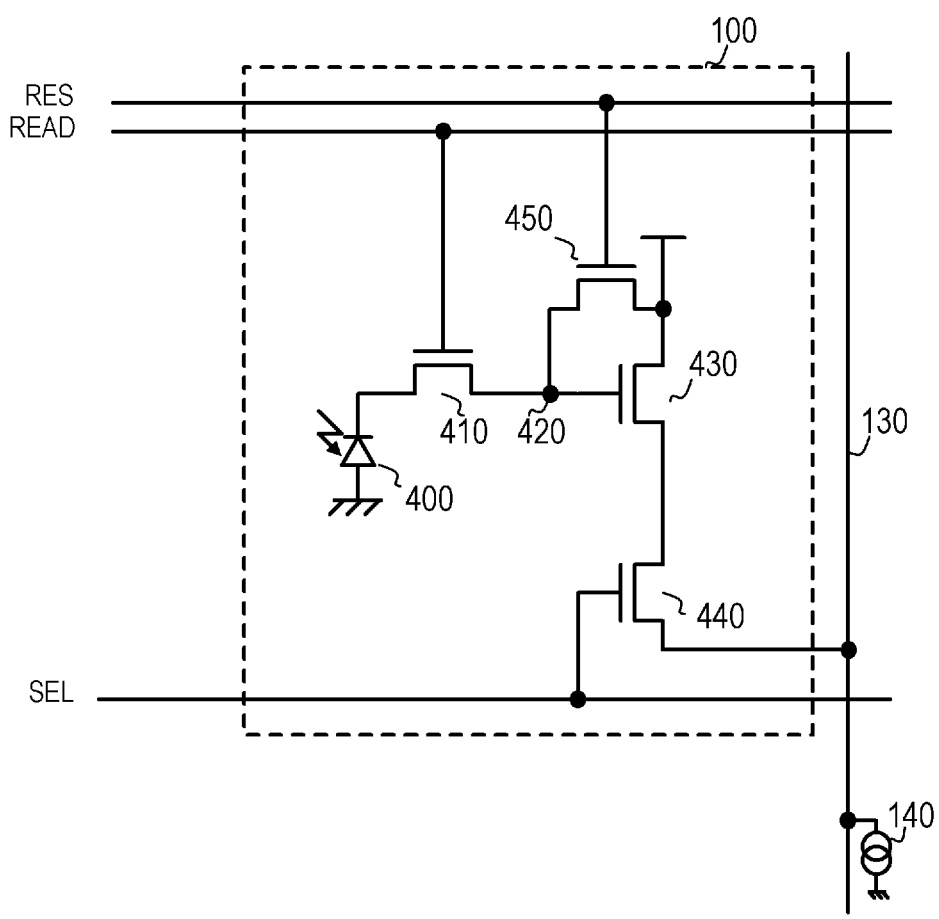
FIG. 2 is a circuit diagram according to Example 1.

An example of the configuration of the pixel circuit 100 will be described with reference to FIG. 2. The pixel circuit 100 include a photodiode 400 (photoelectric conversion element), a transfer transistor 410, a floating diffusion unit 420, an amplifier transistor 430, a selection transistor 440 and a reset transistor 450. The selection transistor 440 is controlled by the level of a selection pulse SEL supplied from a connected signal line. The reset transistor 450 is controlled by the level of a reset pulse RES supplied from the connected signal line. The transfer transistor 410 is controlled by the level of a read pulse READ supplied from the connected signal line.

When the shutter operation is performed, the transfer transistor 410 and the reset transistor 450 are turned ON, so as to reset the charges stored in the photodiode 400. When reading is performed, the reset transistor 450 is turned ON to reset the floating diffusion unit 420, then the transfer transistor 410 is turned ON to transfer the charges stored in the photodiode 400 to the floating diffusion unit 420. These charges are converted into voltage by a capacitor attached to the floating diffusion unit 420. This voltage is read to the signal line 130 by a source-follower constituted by the amplifier transistor 430 and the current source 140. The selection transistor 440 is sequentially selected for each row by the vertical scanning circuit 120 in FIG. 1.

The exposure time of the pixel circuit 100 is the time when the signal charges, corresponding to the signal level of the pixel signal, are generated by the photoelectric conversion element (photodiode 400), and is determined by the opening operation (front curtain) and closing operation (rear curtain) of the shutter. The opening operation and closing operation of the shutter may be performed by a mechanical shutter or an electronic shutter. The mechanical shutter is opened/closed by light shielding of a movable light-shielding unit (described later). The opening operation of the electronic shutter corresponds to the completion of discharging of signal charges by the pixel circuit 100, and the closing operation of the electronic shutter corresponds to the completion of charging of the signal charges by the pixel circuit 100. In other words, in the above mentioned shutter operation, the start time of the exposure time is the time when the charges of the photodiode 400 is reset and the transfer transistor 410 is turned OFF; and the end time of the exposure time is the time when the transfer transistor 410 is turned ON. In the case of using both the mechanical shutter and the electronic shutter, the start of the exposure time may be specified by the later timing of the opening operation of the mechanical shutter or the opening operation of the electronic shutter, and the end of the exposure time may be specified by the earlier operation of: the closing operation of the mechanical shutter or the closing operation of the electronic shutter. An electronic front curtain shutter, which performs the start of the exposure time by the opening operation of the mechanical shutter and the end of the exposure time by the closing operation of the mechanical shutter, may be used.

Timing Control

The operation of Example 1 will be described with reference to a timing diagram in FIG. 3. In Example 1, the reading operation, writing operation to the frame memory, arithmetic processing and output operation of three continuous frames of image data, of which the exposure time is relatively long, short and long, will be described. Hereafter, three frames (frame 1, frame 2, frame 3) forming a set are called a first frame, second frame and third frame respectively. Further, in Example 1, the exposure time that is applied to the first and third frames is called the first exposure time, and the exposure time that is applied to the second frame is called the second exposure time. In the example in FIG. 3, the first exposure time is relatively long, and the second exposure time is relatively short. These exposure time values are predetermined and set in advance or by user operation.

Figure 3:
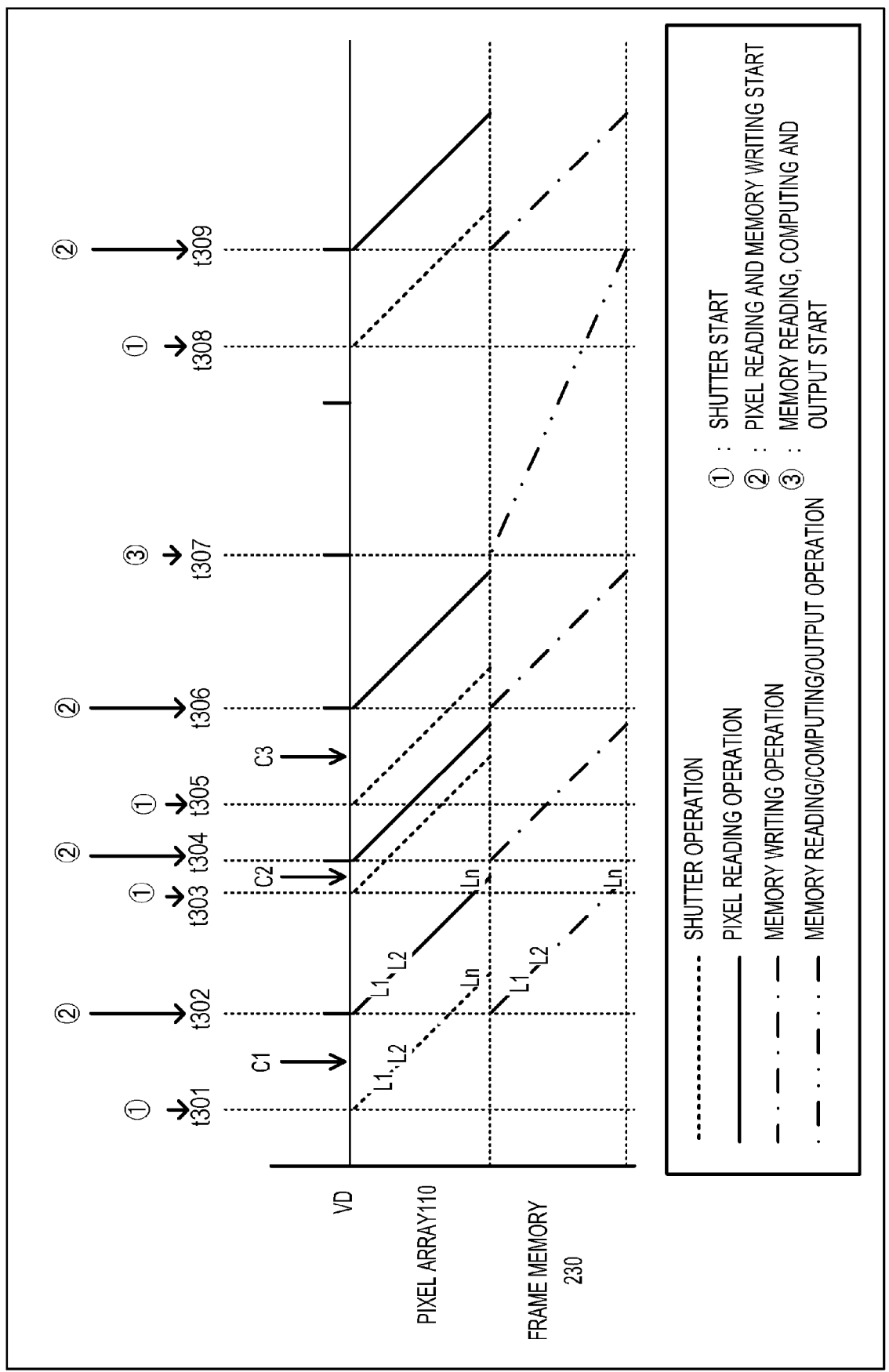
FIG. 3 is a timing diagram according to Example 1.

In FIG. 3, the vertical direction of the pixel array 110 and the frame memory 230 indicates the selected rows in each operation. The abscissa represents the elapsed time, and indicates time t301 to t310 as the timings. "VD" is a signal to control the reading start timing to read each row of the pixel array 110 sequentially. The timing generator 50 controls the sequential operation for each row by outputting these timing signals to the vertical scanning circuit 120. The timing generator 50 can also function as a control unit which outputs various control pulses to the composing elements of the signal processing chip 20 in a subsequent stage. Besides the timing generator 50, a processing circuit which functions as the control unit may be installed in the imaging apparatus 1.

At time t301, the shutter operation of the pixel array 110, that is, the reset operation of the pixel circuits 100 in the pixel array 110, is started before starting reading. In concrete terms, the pixel circuits 100 in the highest row (L1) in the pixel array 110 are reset at the same time, then the pixel circuits 100 in each row are sequentially reset, as in the second highest row (L2), . . . , the lowest row (Ln).

At time t302, the sequential reading operation for each row in the pixel array 110 and the writing operation of signal to the frame memory 230 are started. The exposure time of each pixel circuit 100 at this time is the interval between t301 and t302.

Details will be described below. First the pixel circuits 100 on the highest row (L1) of the pixel array 110 are selected by the vertical scanning circuit 120, whereby signals can be outputted from each pixel circuit 100 to the respective signal line 130. The signals of one row of the pixel circuits 100 are outputted to the signal line 130, which are biased by the current sources 140.

The comparator 160 compares the signal outputted to the signal line 130 with a lamp signal which is supplied by the lamp generator 150. The counter 170 counts time until the signal of the signal line 130 and the lamp signal become the same level, whereby the output of the comparator 160 is inverted. The signal of the signal line 130 differs depending on the amount of changes generated by exposure in the pixel circuit 100, hence this count value is different depending on the intensity of light irradiated to each pixel circuit 100. This count value becomes a value generated by performing analog-digital conversion on the analog pixel signal of the pixel circuit 100. This count value (digital signal) is transferred to the latch unit 180 and held. The plurality of latch units 180 may also be called a line memory.

This digital signal is further sent from the latch unit 180 to the serializer unit 190. The serializer unit 190 performs parallel-serial conversion on the respective digital signal sent from a plurality of columns (two columns in FIG. 1), and sends this serial signal to the memory IF unit 210 in a subsequent stage. The memory IF unit 210 writes the signal sent from the serializer unit 190 to the frame memory 230. At this time, the memory IF unit 210 specifies a row by the row decoder 220, specifies a column by a column decoder included in the memory IF unit 210, and writes the signal to the specified memory cell in the frame memory 230.

In this way, the signals of the pixel circuits 100 on the highest row (L1) in the pixel array 110 are converted into digital signals, and written to the frame memory 230. Then the signals on each row of the pixel array 110 are sequentially read, as in the second row (L2), third row (L3), . . . , lowest row (Ln) as time elapses, and are sequentially written to the frame memory 230. Thereby one frame of image data is written to the frame memory 230. This frame is the first frame having the first exposure time, which is relatively long. The image data is a set of a plurality of pixel data. Each of the plurality of pixel data is generated by converting an analog pixel signal (pixel signal in an analog signal format) into a digital pixel signal (pixel signal in digital signal format) by the analog-digital conversion.

According to the configuration of Example 1, after the digital signals of the latch unit 180 are transferred for a certain row, the reading of the signals on the next row of the pixel circuits 100 can be started while writing the transferred digital signals to the frame memory 230. In other words, while reading a certain row, reading of the next row can be started, hence this configuration can make processing faster.

At time t303, the shutter operation of the pixel array 110 is started again, and each row is sequentially reset (row numbers in FIG. 3 are hereafter omitted to simplify the diagram). Then at time t304, the sequential reading operation for each row of the pixel array 110 and writing the read data of the row to the frame memory 230 are started again. The exposure time of the pixel circuit 100 at this time is the time interval between t303 and t304. This time is shorter than the frame read from the time t302. In other words, from the time t304, reading of image data of which exposure time is changed is performed. This frame is the second frame having the second exposure time, which is relatively short.

At time t305, the shutter operation of the pixel array 110 is started again, and each row is sequentially reset.

Then at time t306, the sequential reading operation for each row of the pixel array 110 and write the read data of the row to the frame memory 230 are started again. The exposure time of the pixel circuit 100 at this time is the time interval between t305 and t306. This time is the same as the time between t301 and t302. This frame is the third frame having the first exposure time, which is relatively long. In this example, the exposure time of the third frame is assumed to be the same as the first exposure time, but the present embodiment is not limited to this. What is required is that the third frame at least corresponds to a third exposure time which is different from the second exposure time.

The difference between the first exposure time and the third exposure time is preferably smaller than the difference between the second exposure time and the first exposure time, and is also preferably smaller than the difference between the second exposure time and the third exposure time. If the exposure time of the third frame is the same as the first exposure time, the difference between the first exposure time and the third exposure time is zero. Then the difference of brightness between the image data of the first frame and the image data of the third frame becomes small. As a result, the difference of brightness between the first image acquired from the image data of the first frame and the image data of the third frame and the second image acquired from the second frame becomes large. This enhances the effect generated by combining the first image and the second image. In this example, the third exposure time is longer than the second exposure time, as in the case of the first exposure time, but the first exposure time and the third exposure time may be shorter than the second exposure time.

In this way, signals having the same exposure time are read in the reading processing started at time t302 and in the reading processing started at time t306. In the reading processing started at time t304, on the other hand, a signal having an exposure time that is different from the above two exposure times is read.

From time t307, three frames of image data are sequentially sent for each row from the frame memory 230 to the computing unit 280 via the memory IF unit 210. Sequentially sending the image data for each row means sending a plurality of pixel data included in the image data for each group of pixel data corresponding to each row of the pixel circuits 100 in the pixel array 110. The computing unit 280 performs computing (e.g. averaging, adding) of the first frame and the third frame, so as to generate an image having a long exposure time. In Example 1, the combined image having a long exposure time that is generated here corresponds to the first image. The image having a short exposure time, on the other hand, corresponds to the second image. To generate this combined image, the computing unit 280 is configured to perform the computing using such a computer resource as a processing circuit. The output unit 290 outputs the image having a long exposure time and the image having a short exposure time (second frame) sequentially for each row. By this operation, the long exposure time image and the short exposure time, of which gravity centers of the exposure time are aligned, can be outputted.

When it is preferable to simultaneously output signals on the same row between two images because of the processor outside the chip, which receives and processes the long exposure time image and the short exposure time image, the output unit 290 may sequentially output the two images in parallel for each row. Needless to say, the manner of output is not limited to this, and the output unit 290 may output the two images in serial. In any case, two images are outputted from the output 290 from time t307 to t309 in FIG. 3. A method of combining the long exposure time image and the short exposure time image based on the difference of the exposure time is, for example, a method of performing weighted addition after applying a gain that corresponds to a ratio of the exposure time to each image.

Effect

As mentioned above, in the case of combining two images (long exposure time image and short exposure time image) to acquire an image in a wide dynamic range, an unnatural image may be generated due to the deviation of the image acquiring timings. In the case of Example 1, on the other hand, a long exposure time image is generated by combining images in the frames before and after the short exposure time image respectively, whereby the gravity centers of the exposure time of the long exposure time image and the short exposure time image are relatively aligned. As a result, deviation of the image acquiring timings decreases, and image quality can be improved.

Further, a number of images that are outputted from the output unit 290 is 2, hence there is no such problems as an increase in power related to the output operation and complicated processing for the side of performing composition processing for a wide dynamic range image. The computing unit 280 may perform the composition processing for a wide dynamic range image. Then power consumption related to the output operation can be decreased, and complicated processing in a subsequent stage can be prevented.

Gravity Center Alignment

In the above description, the gravity centers of the reading start times, to combine the long exposure time image and the short exposure time image, are aligned. In other words, the center time between time t302 (reading start time of the first frame) and time t306 (reading start time of the third frame) overlap with time t304 (reading start time of the second frame).

The method of aligning the gravity centers is not limited to this method. For example, this processing may be performed based on the center time of the exposure time. In concrete terms, for the gravity center of the long exposure time image, the center time C1 of the exposure time (time from t301 to t302) of the frame 1 and the center time C3 of the exposure time (time from t305 to t306) of the frame 3 are assumed. Then the center time between the center times C1 and C3 is acquired. Timing is controlled so that the acquired center time is aligned with the center time of the exposure time of the frame 2, which is the short exposure time image (center time C2 of time from t303 to t304). In the case of FIG. 3 the timing of the frame 3 (time t305 and time t306) may be shifted slightly backward, or the timing of the frame 2 (time t303 and time t304) may shift slightly forward. Further, the time interval between the center time C1 of the exposure time for the frame 1 and the center time C2 of the exposure time for the frame 2 is regarded as the first time interval, and the time interval between the center time C2 of the exposure time for the frame 2 and the center time C3 of the exposure time for the frame 3 is regarded as the second time interval. Here the timing may be controlled so that the difference between the first time interval and the second time interval becomes smaller than the shortest exposure time of the first exposure time to the third exposure time.

As the reading time from the frame memory 230 is shorter, the frame rate can be improved, but the area and power of the output unit 290 increase, and the cost of the image data receiving side outside the chip increases. Therefore in the example in FIG. 3, reading from the frame memory 230 is performed using 2 cycles of VD (time t307 to t309). Further, reading of the pixels and writing to the frame memory 230 are started at the time t309 when reading from the frame memory 230 ends. Furthermore, the shutter operation is started at time t308, which is prior to the reading, so as to acquire the next image more quickly.

Each specific time length of the long exposure time and the short exposure time and the ratio of the long exposure time and the short exposure time should be appropriately set, depending on such conditions and the performance of the members constituting the apparatus and the desired image quality, and need not be predetermined values. For example, in FIG. 3, the time length of the time from t302 to t309 is assumed to be x (e.g. 1/60 sec, 1/120 sec.). In this case, the long exposure may be x/6, and the short exposure may be set to x/24 under dark conditions, and under light conditions, the long exposure may be four times that of dark conditions, and the short exposure may be set to 20 μs.

Modification

Figure 4:
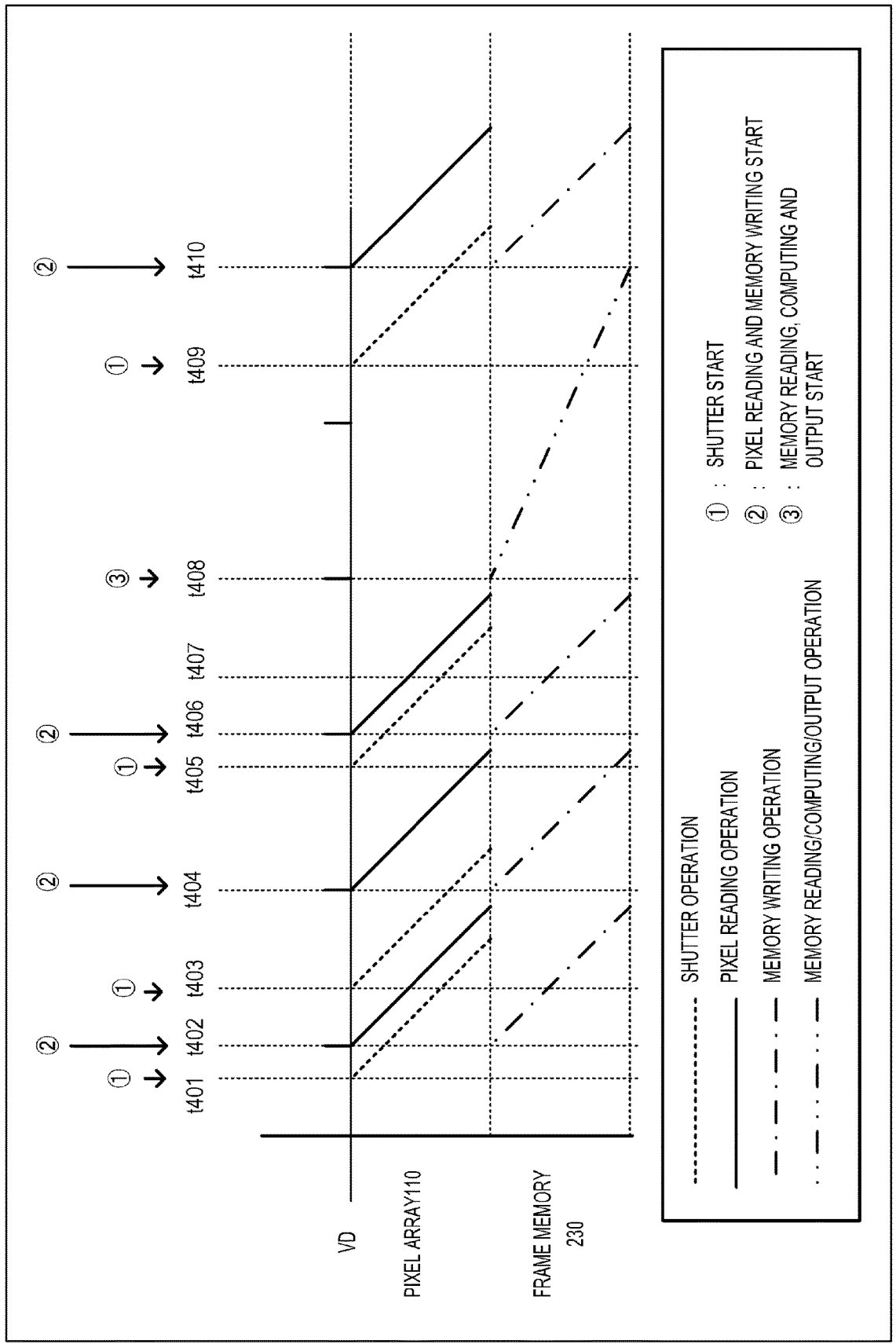
FIG. 4 is a timing diagram according to Modification.

In FIG. 3, the first and third frames are long exposure time images, and the second frame is the short exposure time image, this however may be reversed. In other words, the first and third frames may be short exposure time images and the second frame may be a long exposure time image. FIG. 4 is a timing diagram according to this modification. As illustrated in FIG. 4, the exposure time of the first frame (time t401 to t402) and the exposure time of the third frame (time t405 to t406) is relatively short, and the exposure time of the second frame (time t403 to t404) is relatively long. In the case of FIG. 4, as in the case of FIG. 3, various methods may be used to align the gravity centers of the two short exposure times, such as a method of aligning the gravity centers of the pixel reading start time, and a method of aligning the gravity centers of the center time of the exposure time.

The example in FIG. 4 is preferable in terms of decreasing the processing time, since the time from the start of the shutter operation in the first frame to the start of the pixel reading in the third frame (time t401 to t406) can be decreased.

All three frames may be images having the same exposure time, so that the long exposure time image is acquired by adding the first and third frames, and the second frame is regarded as the short exposure time image.

A number of frames is not limited to three, and more frames may be used. In the case of using five frames, for example, the exposure times of the first to fifth frames are sequentially set as "short, long, short, long, short", so that the short exposure time images are acquired from the first, third and fifth frames, and the long exposure time images are acquired from the second and fourth frames. Then using the acquired short exposure time images and the long exposure time images, an image having a wider dynamic range can be acquired. This sequence of the exposure times may be "long, short, long, short, long".

Example 2

Figure 5:
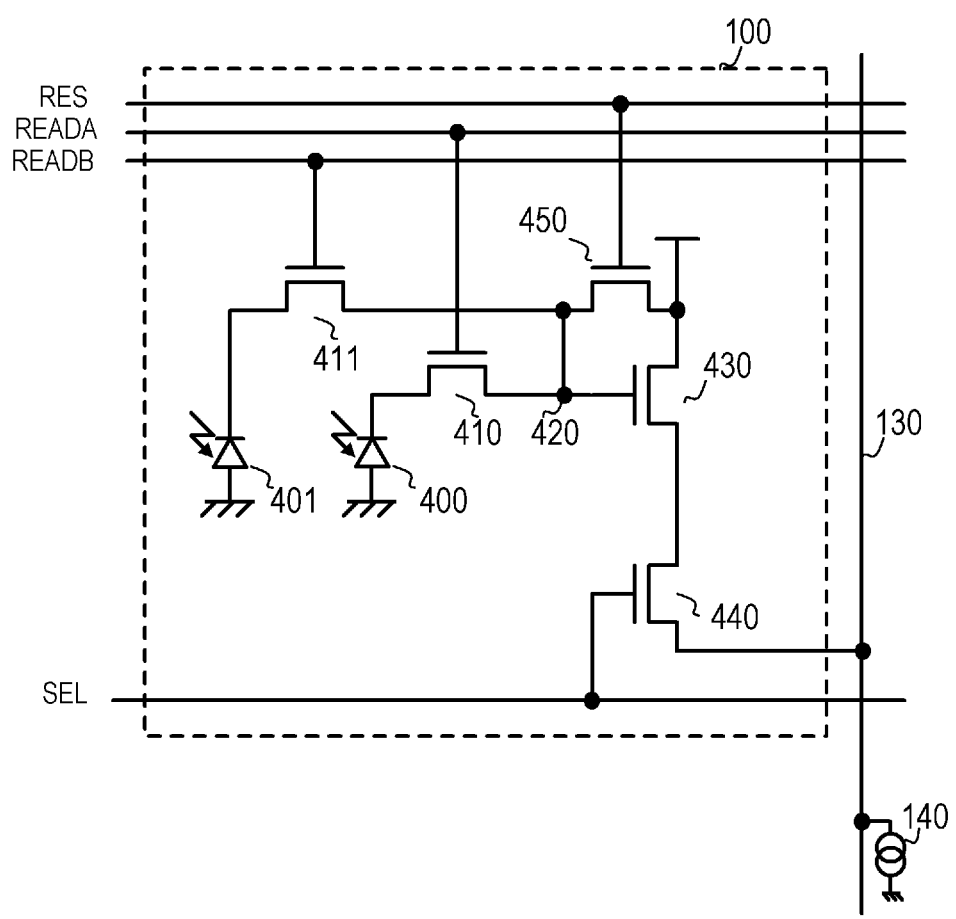
FIG. 5 is a circuit diagram according to Example 2.

FIG. 5 is a circuit diagram of a pixel circuit 100 according to Example 2. In the following, primarily the differences from Example 1 will be described, and a same portion is denoted with a same reference sign as Example 1, of which description will be simplified.

The pixel circuit 100 in FIG. 5 includes a pair of photodiodes 400 and 401 and a pair of transfer transistors 410 and 411. The photodiode 400 may be called a first photodiode, and the photodiode 401 may be called a second photodiode. From the pixel circuit 100 of Example 2, signals may be read from both the pair of photodiodes 400 and 401, or a signal may be read selectively from one of the photodiodes. Thereby two images having parallax between an image based on the signal acquired from the photodiode 400 (hereafter called A image) and an image based on a signal acquired from the photodiode 401 (hereafter called B image) can be acquired. From these two images, information to detect a focal point, that is, to perform autofocus (AF), can be acquired. Further, by making these two images into one image format, an image of which focus is adjustable after photographing can be acquired. Furthermore, by adding both signals of the photodiodes 400 and 401 by the floating diffusion unit 420 and reading the added signals, an image having good SN (hereafter called A+B image) can be acquired.

Figure 6:
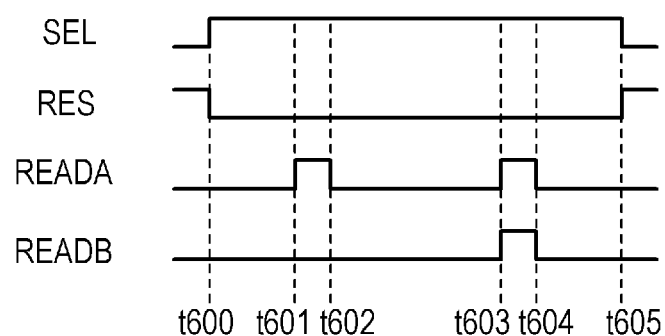
FIG. 6 is a timing diagram according to Example 2.

An operation example of the pixel circuit 100 in FIG. 5 will be described with reference to FIG. 6. At time t600, the selection transistor 440 is turned ON by setting the selection pulse SEL to high level. Further, the reset transistor 450 is turned OFF by setting the reset pulse RES to low level.

Then from t601 to t602, the transfer transistor 410 is turned ON (READA=high), so as to transfer charges stored in the photodiode 400 to the floating diffusion unit 420. Thereby a pixel signal based on the charges of the photodiode 400 is read to the signal line 130, and AD conversion is performed in a subsequent stage.

Then from time t603 to t604, the transfer transistors 410 and 411 are turned ON (READA, READB=high), so as to transfer charges stored in the photodiodes 400 and 401 to the floating diffusion unit 420. Thereby an addition signal based on the charges of the photodiodes 400 and 401 is read to the signal line 130, and AD conversion is performed in a subsequent stage.

Thereby one row of signals of the A image and the A+B image are acquired. By repeating this step sequentially for each row at time t605 and later, the A image and the A+B image are acquired. According to the method in FIG. 6, the A image and the A+B image having good SN can be acquired. Further, the B image can also be acquired from the difference between the A+B image and the A image, and the AF information and the like can be acquired as well.

It is also possible to read only the A image, only the B image or only the A+B image. In the case of acquiring only the A+B image, the AF information and the like are not acquired, and reading becomes faster.

Here the relationships between each frame and a target image of reading pixels and writing to the frame memory 230, in the case where the image is generated in accordance with the timing diagram in FIG. 3 using the pixel circuit 100 of Example 2, are set as follows.

Frame 1 (reading time t302~): writing the A image to the frame memory 230
Frame 2 (reading time t304~): writing the A+B image to the frame memory 230
Frame 3 (reading time t306~): writing the A image to the frame memory 230

Thereby the targets of the reading from the frame memory 230, the computing and output (frame time t308~) become the long exposure time image generated by combining the A images in frames 1 and 3 and the short exposure time image which is the A+B image in frame 2.

In frame 2, only the A+B image is read, therefore reading can be faster and distortion of an image caused by the rolling reading operation can be decreased. It is also possible to acquire AF information and the like from the difference between the combined A images of frames 1 and 3 and the A+B image of the frame 2. In this case, the negative influence on AF information can be suppressed if the gravity center of the exposure time in frames 1 and 3 and the gravity center of the exposure time in frame 2 are aligned. For example, if there is an object that is captured in the A+B image and this image is not captured in the A image, this image is captured in the B image, which is acquired by determining the difference between the A image and the A+B image. This state drops the AF accuracy, which is performed based on the comparison of the A image and the B image.

As described above, in Example 2, the image distortion of the A+B image can be improved, and at the same time, the negative influence on AF can be suppressed by aligning the gravity centers of the exposure times of the A image and the A+B image.

In addition to the processing to generate one A image by combining two A images, the computing unit 280 may acquire information on the B image based on the difference between the combined A image and the A+B image, compute AF based on the information on the A image and the B image, and output only the computed result of AF and the A+B image. Then the power consumption related to the output operation can be decreased, and processing in a subsequent stage can be less complicated. Further, by outputting the computed result of AF first, driving of the lens for the next imaging can be started more quickly.

If AF is computed only for a part of the screen, the A image may be extracted only for a part of the pixel circuits 100 of the screen, and written to the frame memory 230. For reading as well, only a part of the A image may be read from the frame memory 230. In this configuration, the pixel circuit includes a pair of photodiodes as the photoelectric conversion elements, but a number of photoelectric conversion elements is not limited to this, as long as at least two photodiodes are used. Example 2 can be applied even when a number of photodiodes is three or more.

Example 3

Figure 7:
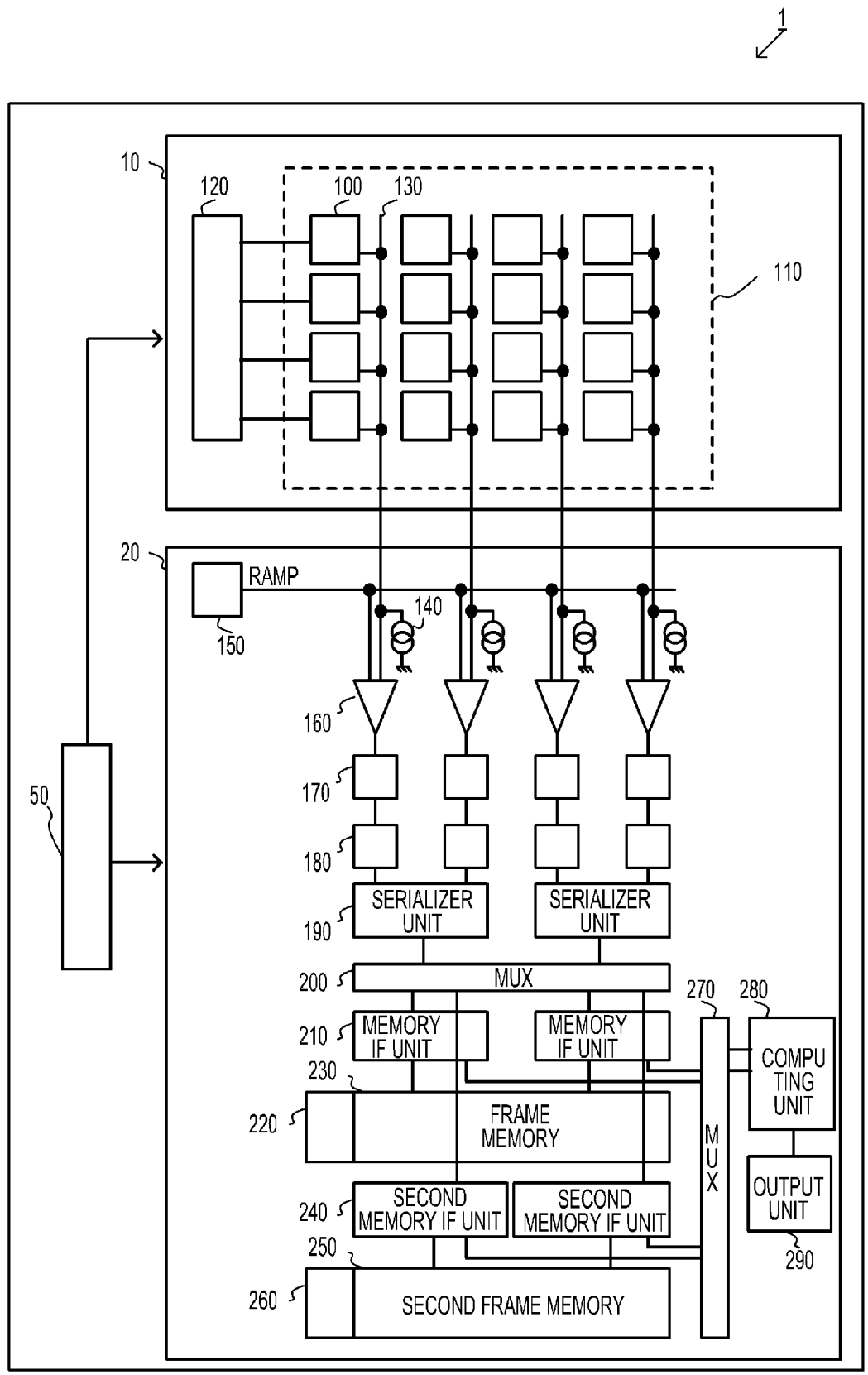
FIG. 7 is a schematic diagram depicting an imaging apparatus according to Example 3.

FIG. 7 is a schematic diagram depicting an imaging apparatus according to Example 3. In the following, primarily the differences from Example 1 will be described and a same portion is denoted with a same reference sign as Example 1, of which description will be simplified.

The signal processing chip 20 in FIG. 7 further includes a multiplexer 200, a second memory IF unit 240, a second frame memory 250, a second row decoder 260 and a second multiplexer 270. In this case, the frame memory 230 may be called a first memory, and the second frame memory 250 may be called a second memory.

A timing diagram in the case where three frames of image data are read and two frames of image data are outputted, just like the above examples, using the imaging apparatus in FIG. 7, will be described with reference to FIG. 8. Here primarily the differences from FIG. 3 will be described. In FIG. 3, after waiting for time t309 when reading from the frame memory 230 (time t307 to t309) ends, reading of the next pixel is performed.

Figure 8:
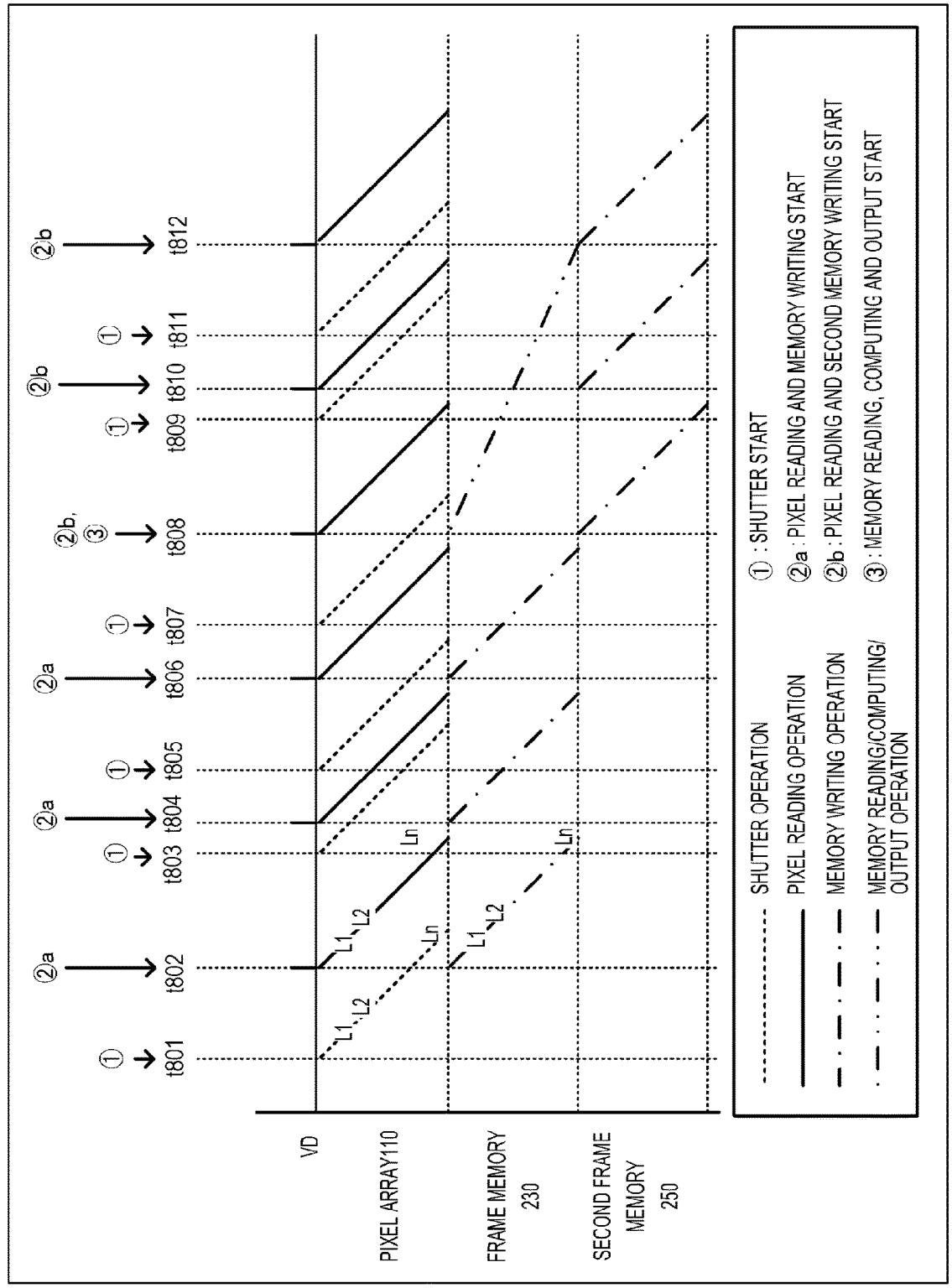
FIG. 8 is a timing diagram according to Example 3.

In FIG. 8, the timing diagram at time t807 and later is different from FIG. 3. In concrete terms, the shutter operation is performed at t807. Then from time t808, pixel signals are read from the pixel array 110 and written to the second frame memory 250, in parallel with the reading operation from the frame memory 230, the computing and the output. At this time, the multiplexer 200 is assumed to be connected with the serializer unit 190 and the second memory IF unit 240.

The multiplexer 200 functions as a selection unit which selects either the frame memory 230 or the second frame memory 250 as a memory to which the read image data is stored. Thus in Example 3, the destination of writing the image data is selectively determined. Thereby while reading of data on the first frame group (frame group exposed at time t801~, time t803~, and time t805 respectively) from one of the frame memories is performed, data on the second frame group (frame group exposed at time t807~, time t809~, and time t811~ respectively) can be written to the other frame memory.

By writing data to the second frame memory 250 in parallel with reading data from the frame memory 230 like this, a drop in frame rate caused by the output operation from the frame memory can be prevented, and processing speed can be increased. In FIG. 8, a time approximately equivalent to two VD units is required to output data from the frame memory 230. However, the frame rate is not affected even if the reading processing takes a time approximately equivalent to three VD Units, as long as output is completed before writing data to the frame memory 230 the next time.

In Example 3, compared with Example 1, the second frame memory and the like must be added, but the output frame rate improves and the speed of reading data from the frame memory allowably slows. For the three frames of images, a combination of the A image and the A+B image, as in the case of Example 2, may be used.

Example 4

In Example 4, another example of the image processing operation using the imaging apparatus in FIG. 7 will be described. In Examples 1 to 3, it is assumed that three frames are read and two frames are outputted. In Example 4, however, two frames are read and outputted.

Figure 9:
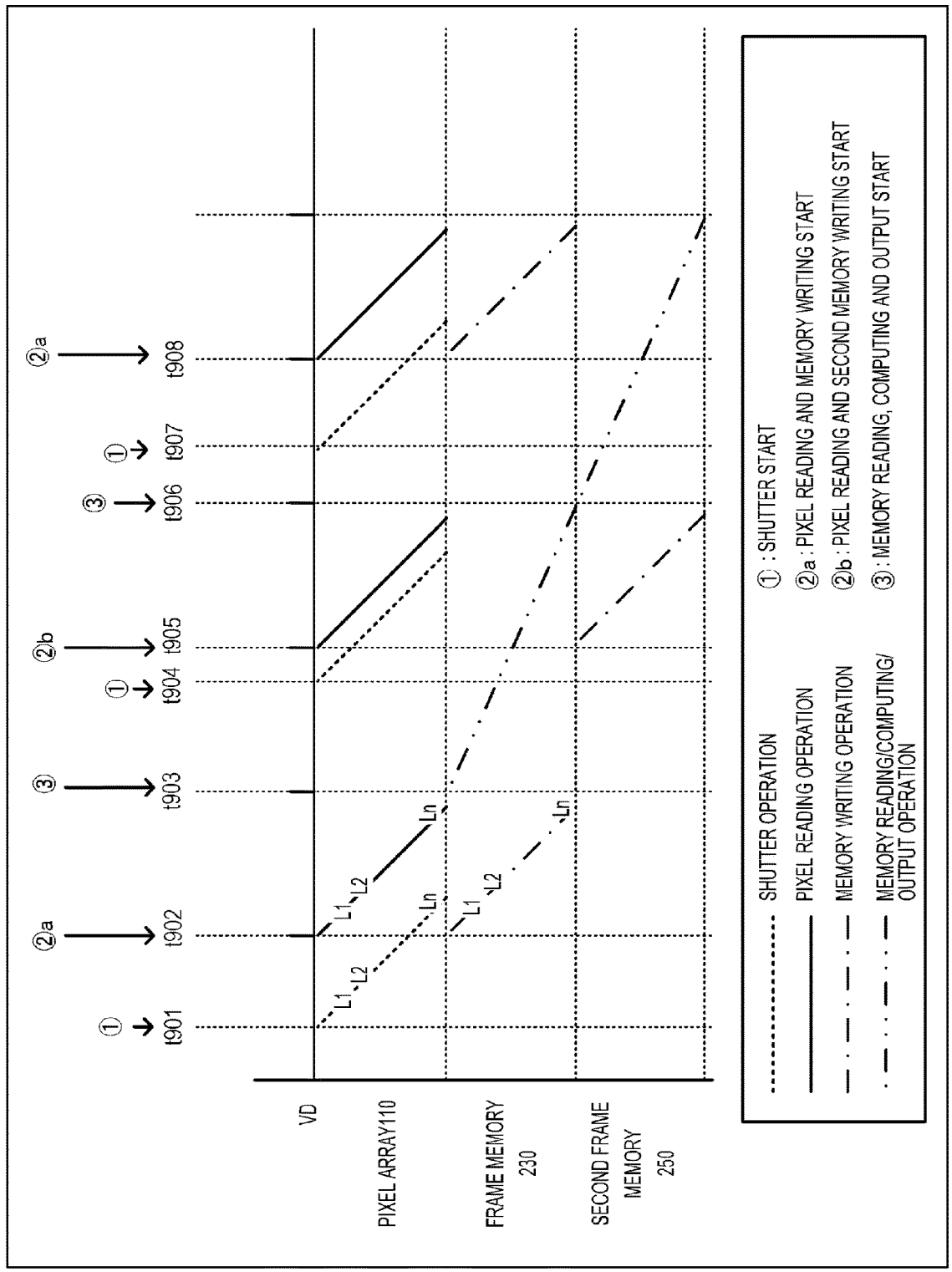
FIG. 9 is a timing diagram according to Example 4.

The operation of Example 4 will be described with reference to the timing diagram in FIG. 9. Prior to the start of reading pixels at time t902, the shutter operation of the pixel array 110 is started at time t901. At this time, the sequential reading operation for each row of the pixel array 110 and the writing signals to the frame memory 230 are started. At time t902, the exposure time of the pixel circuit 100 is the time interval between t901 and t902. During this time, the multiplexer 200 connects the serializer unit 190 with the memory IF unit 210. The memory IF unit 210 writes the signals sent from the serializer unit 190 to the frame memory 230. Thereby one frame of image data is written to the frame memory 230.

Then at time t903, reading from the frame memory 230 is started. At this time, the second multiplexer 270 connects the memory IF unit 210 to a subsequent stage. Then the image signals from the frame memory 230 are read from the output unit 290.

At time t904, shutter operation is started, and at time t905, reading of the pixel signals is started. At this time, the multiplexer 200 connects the serializer unit 190 with the second memory IF unit 240. Thereby at time t905, when the frame memory 230 is being read, the next reading of the pixel signals and writing to the second frame memory 250 can be started. At time t906, reading of the signals of the second frame memory 250 is started. Computing between the two frames is performed outside the chip. Then at time t907, when the reading from the second frame memory 250 is continuing, the shutter operation is performed, and at time t908, writing to the frame memory 230 is started again.

As described above, disposing of the multiplexer 200, the second frame memory 250 and the second multiplexer 270 makes it possible to write to another frame memory while reading from the current frame memory. Thereby when computing is performed using two images, the simultaneity of the two images can be improved.

In Example 4, only two frames are read, hence compared with Examples 1 to 3, the gravity centers of the exposure time of the two images are more likely to deviate. Further, the configuration of the second frame memory must be added. However, since the reading of image data is only for two frames, time and power related to the reading can be decreased. Furthermore, the frame rate improves, and the speed of reading data from the frame memory allowably slower.

In Example 4, the improvement of simultaneity of the long time exposure image and the short time exposure image was described, but the A image and the A+B image may be used as the two images, as in the case of Example 2.

Further, even in the case where two images having the same exposure time are added or averaged using the configuration in FIG. 7, the SN and simultaneity of the two images can be improved, and an effect to decrease distortion of a moving body can be expected.

Furthermore, in the case where a moving body is detected based on the difference of two images having the same exposure time using the configuration in FIG. 7, improving the simultaneity of the two images in advances improves the accuracy of detection.

Example 5

Figure 10:
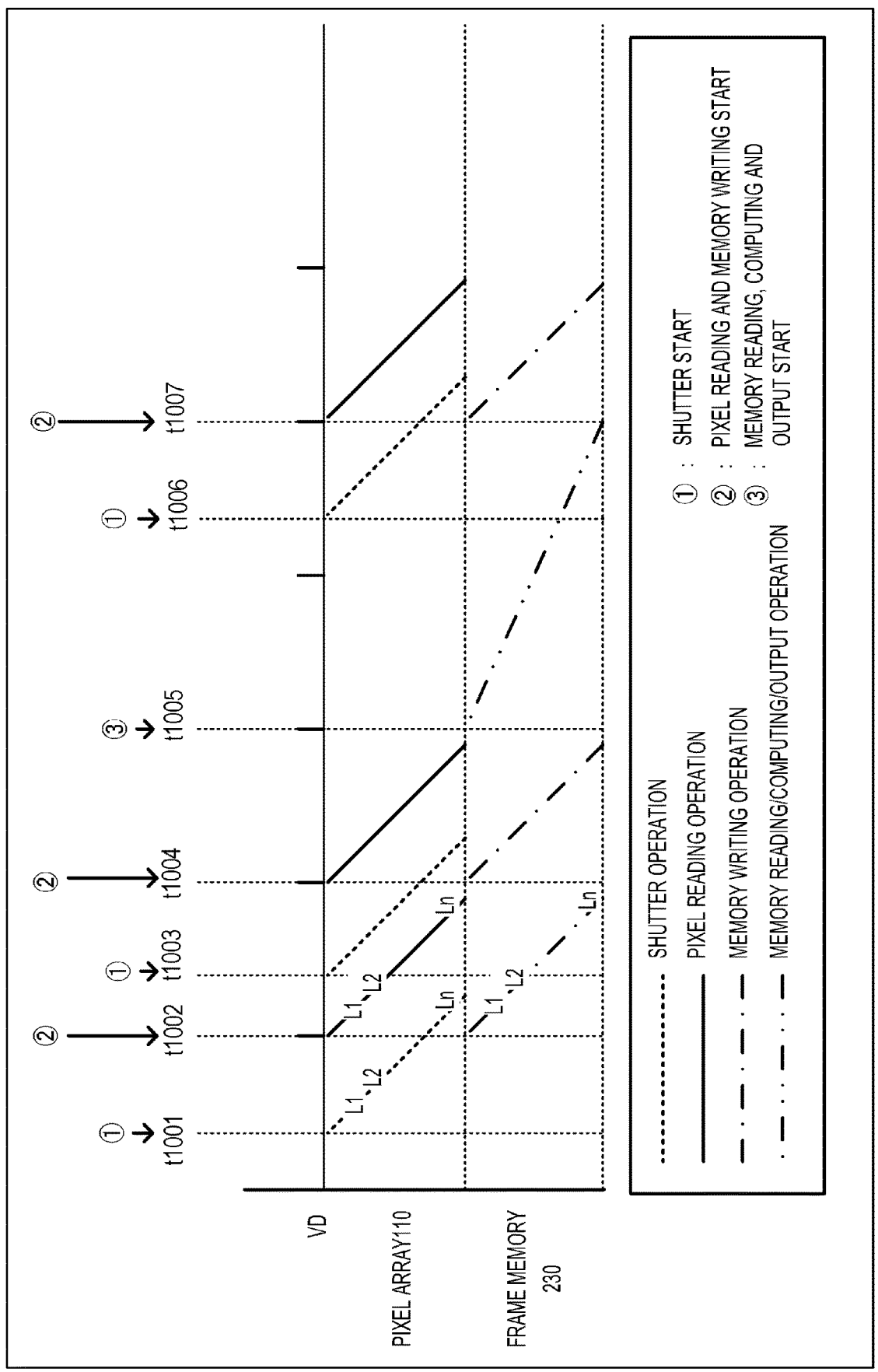
FIG. 10 is a timing diagram according to Example 5.

FIG. 10 is a timing diagram according to Example 5. In Example 5, an operation example to improve simultaneity, when computing is performed using two images in the circuit block configuration of the imaging apparatus in FIG. 1, will be described. In FIG. 10, two images are written to the frame memory 230 at time t1002~ and at time t1004~. Then at time t1005, the two images are sequentially read from the frame memory 230 for each row, then the computing unit 280 performs computing using the two images, and outputs the images from the output unit 290. As a result, compared with the case of FIG. 9, simultaneity of the two images can be further improved. Needless to say, the simultaneity of the images is improved, even compared with the case of processing in the sequence of "writing to the frame memory 230 (first image)→reading from the frame memory 230→writing to the frame memory 230 (second image)".

Here a case where the image to be written to the frame memory 230 from time t1002 is the A+B image, and the image to be written to the frame memory 230 from time t1004 is the A image in FIG. 10 will be further described as an example. Just like Example 2, if the first image is the A+B image, rolling distortion can be decreased. Further, since the frame memory 230 is included, reading of the pixel signals (that is, writing to the frame memory 230) can be faster, regardless the operation speed of the output unit 290.

In FIG. 10, prior to reading the A+B image from the frame memory 230, writing the A image to the frame memory 230 is started at time t1004, so as to continue the writing of the A+B image to the frame memory 230. Thereby information for the AF processing is acquired. By continuously writing the A+B image and the A image like this, the simultaneity of the two images can be improved, and deterioration of the AF accuracy can be suppressed. Then the shutter operation is started at time t1006, and writing of the next image to the frame memory is started at time t1007.

In the computing and outputting from time t1005, only the regions of interest of the A+B image and the A image are read from the frame memory 230 first, and the computing result of the AF information is outputted first, whereby the start of driving the lens for the next imaging can be quickened. In this case, the A+B image and the A image can be read thereafter.

Modification of Imaging Apparatus

In each of the Examples 1 to 5, the imaging apparatus using two chips (the photoelectric conversion chip 10 and the signal processing chip 20), was described as examples, but the present invention is not limited to this. For example, as illustrated in FIG. 11, a second signal processing chip 30, which includes a configuration of a subsequent stage of the serializer unit 190, may be disposed, so that the three chips are used. According to this configuration, the structure of the imaging apparatus can be flexibly determined. A number of chips and a chip on which each composing element is disposed are arbitrary, and the imaging apparatus may be appropriately configured in accordance with such conditions as the apparatus scale, cost and the desired processing capacity.

Application Example to Imaging System

Figure 12:
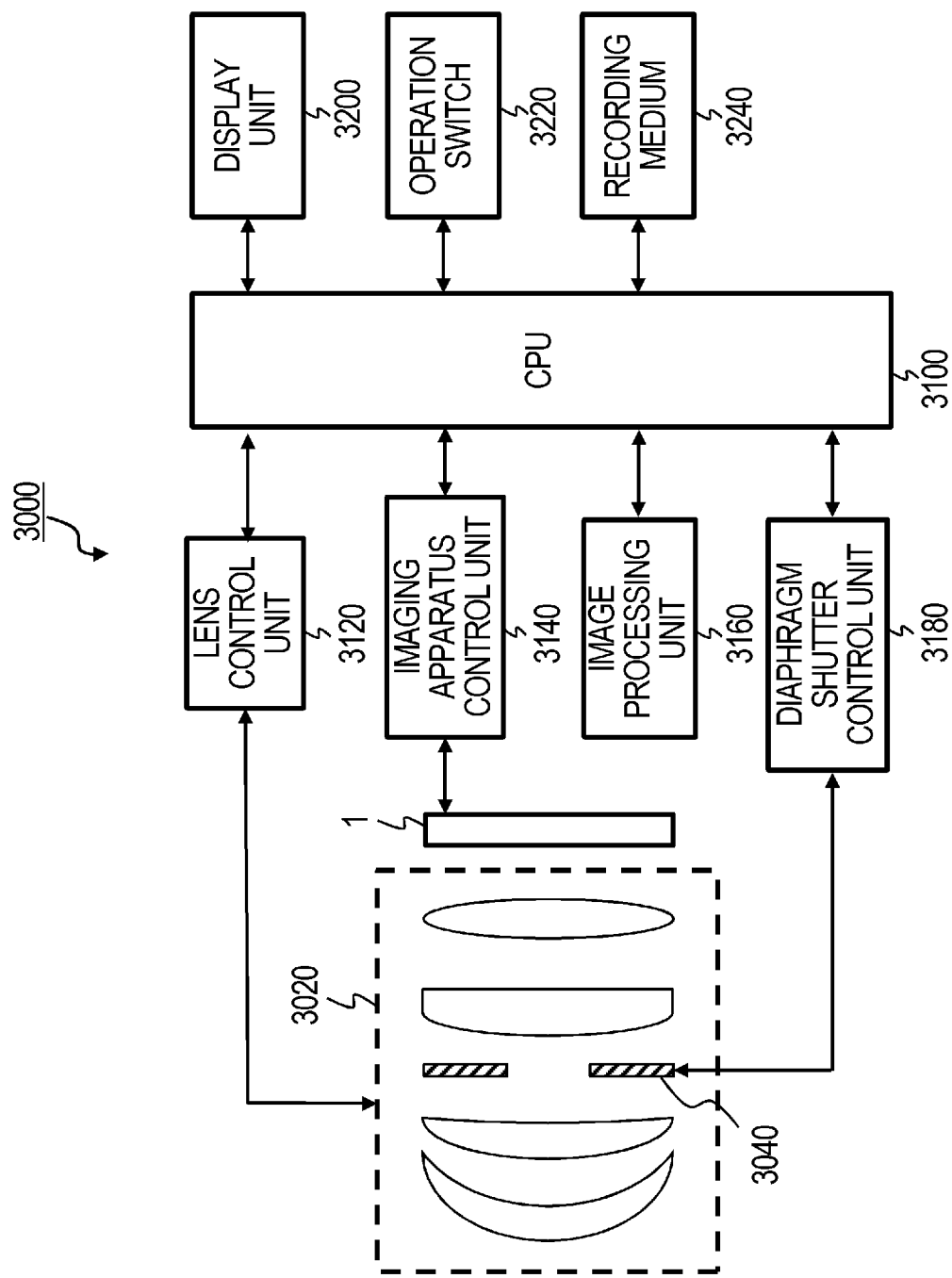
FIG. 12 is a schematic diagram depicting a configuration of an imaging system using the imaging apparatus.

An application example of the present embodiment to an imaging system will be described with reference to the schematic diagram in FIG. 12. The imaging apparatus 1 described in each of the Examples 1 to 5 can be applied to various imaging systems. The imaging systems to which the imaging apparatus 1 can be applied are, for example, a digital still camera, a digital camcorder, a surveillance camera, a copier, a facsimile, a portable telephone, an onboard camera and an observation satellite. A camera module which includes an optical system (e.g. lens) and the imaging apparatus is also included in the imaging system. As an example of these imaging systems, FIG. 12 indicates a block diagram of a digital still camera.

The imaging system 3000 includes an imaging optical system 3020, a CPU 3100, a lens control unit 3120, an imaging apparatus control unit 3140, an image processing unit 3160, a diaphragm shutter control unit 3180, a display unit 3200, an operation switch 3220 and a recording medium 3240.

The imaging optical system 3020 is an optical system to form an optical image of an object, and includes a lens group and a movable light shielding unit 3040. The movable light shielding unit 3040 has a function as a shutter for exposure time adjustment (the above mentioned mechanical shutter) when a still image is captured, and can also include a diaphragm function which adjusts light quantity during photography by adjusting the opening diameter thereof. The lens group and the movable light shielding unit 3040 are held such that movement along the optical axis direction is possible, and a variable power function (zoom function) and a focal point adjustment function by an interlocking operation of these units are implemented. The imaging optical system 3020 may be integrated with the imaging system, or may be an imaging lens that can be attached to the imaging system.

The imaging apparatus 1 is disposed so that the imaging surface thereof is located in the image space of the imaging optical system 3020. The imaging apparatus 1 is constituted by a CMOS sensor (imaging region) and peripheral circuits thereof (peripheral circuit region). The imaging apparatus 1 constitutes a two-dimensional single-plate color sensor, where pixel circuits including a plurality of photoelectric conversion elements are two-dimensionally disposed, and color filters are disposed for these photoelectric conversion elements. The imaging apparatus 1 performs photoelectric conversion on an object image formed by the imaging optical system 3020, and outputs the converted object image as imaging signals and focal point detection signals.

The lens control unit 3120 performs the zoom operation and the focal point adjustment by controlling the driving movement of the lens group of the imaging optical system 3020, and is constituted by circuits and processors which are configured to implement these functions. The diaphragm shutter control unit 3180 adjusts the exposure time by controlling the open/close of the movable light shielding unit 3040, and is constituted by circuits and processors which are configured to implement these functions. In the case where the movable light shielding unit 3040 includes a diaphragm function, the diaphragm shutter control unit 3180 adjusts the photographing light quantity by changing the opening diameter of the movable light shielding unit 3040 (by making the diaphragm value variable), and the diaphragm shutter control unit 3180 is constituted by circuits and processors which are configured to implement these functions. The diaphragm shutter control unit 3180 may be called a light shielding control unit.

The CPU 3100 is a controller inside the camera which performs various controls of the camera main body, and includes a computing unit, a ROM, a RAM, an A/D convertor, a D/A convertor, a communication interface circuit and the like. The CPU 3100 controls the operation of each unit in the camera in accordance with a computer program stored in ROM or the like, and executes a series of photographing operations, such as AF, including detecting the focus state (focal point detection) of the imaging optical system 3020, imaging, image processing and recording. The CPU 3100 is also a processing unit.

The imaging apparatus control unit 3140 controls the operation of the imaging apparatus 1, and performs A/D conversion on the signal outputted from the imaging apparatus 1, and sends the converted signals to the CPU 3100, and is constituted by circuits and controllers configured to implement these functions. The A/D conversion function may be included in the imaging apparatus 1. The image processing unit 3160 generates image signals by performing image processing, such as y conversion and color interpolation, on the A/D converted signals, and is constituted by circuits and controllers configured to implement these functions. The display unit 3200 is a display apparatus, such as a liquid crystal display apparatus (LCD), and displays information on the photographing mode of the camera, a preview image before photographing, a confirmation image after photographing, a focusing state during focal point detection and the like. The operation switch 3220 is constituted by a power switch, a release (photographing trigger) switch, a zoom operation switch, a photographing mode selection switch and the like. The recording medium 3240 records photographed images, and may be a recording medium enclosed in the imaging system, or may be a removable recording medium, such as a memory card.

By configuring the imaging system 3000 like this, by applying the imaging apparatus 1 according to each example, a high performance imaging system, that can adjust the focal point at high accuracy and acquire an image having a deep depth of field, can be implemented.

Application Example to Moving Body

Figure 13A:
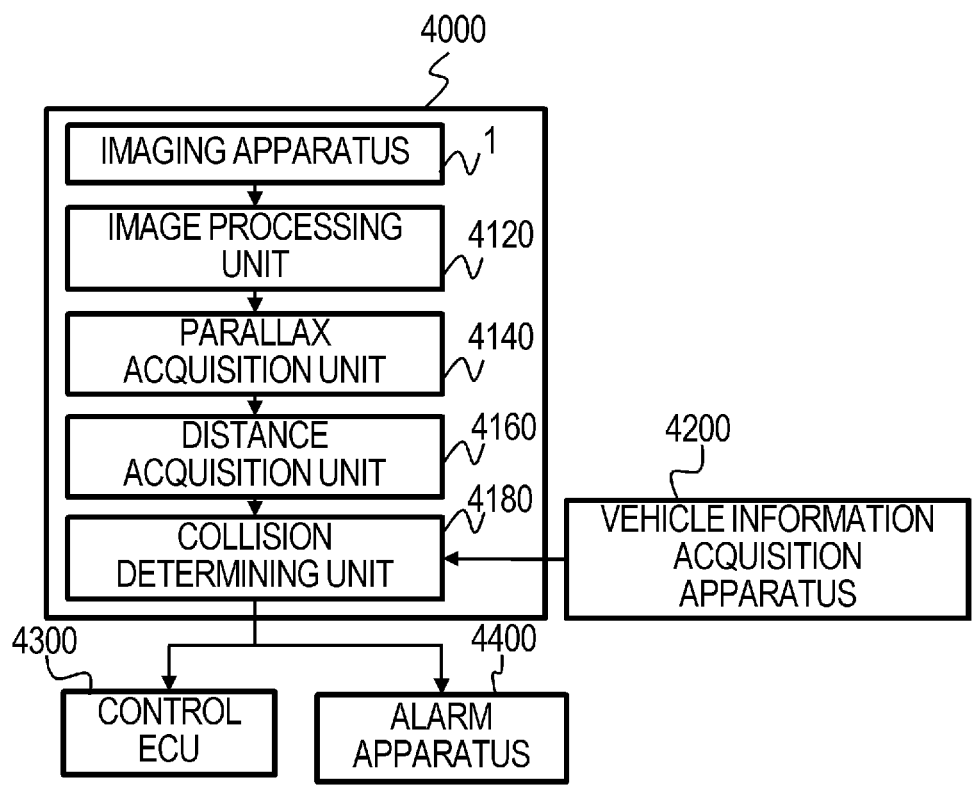
FIG. 13A is a diagram depicting a system using the imaging apparatus.
Figure 13B:
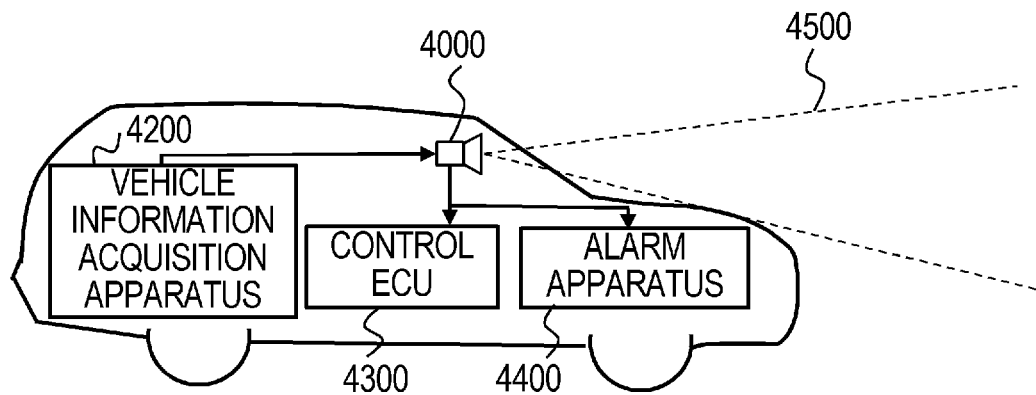
FIG. 13B is a diagram depicting a moving body using the imaging apparatus.

An imaging system and a moving body of this embodiment will be described with reference to FIG. 13A and FIG. 13B. FIG. 13A indicates an example of an imaging system 4000 of an onboard camera. The imaging system 4000 includes the imaging apparatus 1 according to any one of the imaging apparatuses of Examples 1 to 5 described above. The imaging system 4000 includes an image processing unit 4120 which performs image processing on a plurality of image data acquired by imaging apparatus 1, and a parallax acquisition unit 4140 which calculates parallax (phase difference of parallax images) from the plurality of image data acquired by the imaging apparatus 4100. The imaging system 4000 also includes a distance acquisition unit 4160 which calculates a distance to the object based on the calculated parallax, and a collision determining unit 4180 which determines whether collision is possible based on the calculated distance. Here the parallax acquisition unit 4140 and the distance acquisition unit 4160 are examples of the distance information acquisition unit which acquires distance information on the distance to the object. In other words, the distance information is information on parallax, defocus amount, distance to the object and the like. The collision determining unit 4180 may determine the collision possibility by using one of this distance information. The distance information acquisition unit may be implemented by designing dedicated hardware, or may be implemented by a software module. Further, the distance information acquisition unit may be implemented by a field programmable gate array (FPGA), an application specific integrated circuit (ASIC) or the like, or may be implemented by combining these components.

The imaging system 4000 is connected with a vehicular information acquisition apparatus 4200, and can acquire such vehicular information as vehicle speed, yaw rate and rudder angle. Further, the imaging system 4000 is connected with a control ECU 4300, which is a controller to output a control signal for generating a braking force to the vehicle based on the determination result by the collision determining unit 4180. In other words, the control ECU 4300 is an example of a moving body control unit which controls the moving body based on the distance information. The imaging system 4000 is also connected with an alarm apparatus 4400 which emits an alarm to the driver based on the determination result by the collision determining unit 4180. For example, if the collision possibility is high based on the determination result by the collision determining unit 4180, the control ECU 4300 controls the vehicle to avoid collision and minimize damage by applying the brakes, releasing the accelerator and suppressing engine output, for example. The alarm apparatus 4400 sends an alarm to the user by sound an alarm, displaying alarm information on a screen of a car navigation system, or causing vibration to the seat belt or steering wheel, for example.

In this example, an area around the vehicle, such as the front or rear of the vehicle, is imaged by the imaging system 4000. FIG. 13B illustrates the imaging system 4000 in the case of imaging the front of the vehicle (imaging range 4500). The vehicular information acquisition apparatus 4200 sends an instruction to operate the imaging system so that imaging is executed. By using the imaging apparatus 1 of each example of Examples 1 to 5 described above, the accuracy of distance measurement by the imaging system 4000 can be further improved.

In the examples described above, control is performed to avoid collision with another vehicle, but the present invention can also be applied to a control for automatic driving when following another vehicle, or control for automatic driving without deviating from the driving lane. Further, application of the imaging system is not limited to a vehicle, such as an automobile, but may also be applied to a moving body (moving apparatus) such as a ship, an airplane and an industrial robot. In addition, application of the imaging system is not limited to moving bodies, but can also be applied to various apparatuses that use object recognition, such as an intelligent transport system (ITS).

Furthermore, the present invention can be used in various fields, such as an image sensor that is used for a medical image acquisition apparatus, an image sensor used for an inspection apparatus for precision components, and an image sensor used for a monitoring camera.

According to the present invention, image quality can be improved when a plurality of images are combined in the imaging apparatus.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-147010, filed on Aug. 3, 2018, which is hereby incorporated by reference herein in its entirety.

What is claimed is:
1. An imaging apparatus comprising:
a plurality of pixel circuits;
a memory;
a signal processing unit configured to generate image data based on pixel signals read from the plurality of pixel circuits and to store the image data in the memory; and
a computing unit configured to generate an image based on the image data,
wherein the signal processing unit reads pixel signals from the plurality of pixel circuits during a predetermined time, and stores the pixel signals in the memory as image data corresponding to one frame, and
wherein the signal processing unit stores at least (1) image data corresponding to a first frame which corresponds to a first exposure time, (2) image data corresponding to a second frame which corresponds to a second exposure time that is different from the first exposure time, and (3) image data corresponding to a third frame which corresponds to a third exposure time that is different from the second exposure time,
wherein the exposure for the second frame is performed between the exposure for the first frame and the exposure for the third frame,
wherein the computing unit generates a first image using the image data corresponding to the first frame and third frame stored in the memory, and generates a second image using the image data corresponding to the second frame stored in the memory,
wherein the difference between the first exposure time and the third exposure time is less than at least one of (1) the difference between the second exposure time and the first exposure time and (2) the difference between the second exposure time and the third exposure time,
wherein a pixel line which is read for the first frame is read for the third frame,
wherein the memory is configured to include a first memory and a second memory,
wherein the imaging apparatus further includes a selecting unit configured to select one of the first memory and the second memory to store the image data that was generated by the signal processing unit based on pixel signals read from the plurality of pixel circuits, and
wherein, while the computing unit performs reading from one of the first memory and the second memory, the signal processing unit stores the image data to the other of the first memory and the second memory.

2. The imaging apparatus according to claim 1, wherein the computing unit is further configured to combine the first image and the second image.

3. The imaging apparatus according to claim 1, wherein the first exposure time and the third exposure time are longer or shorter than the second exposure time.

4. The imaging apparatus according to claim 1, wherein the difference between the first exposure time and the third exposure time is less than (1) the difference between the second exposure time and the first exposure time, and (2) the difference between the second exposure time and the third exposure time.

5. The imaging apparatus according to claim 1, wherein the third exposure time is equal to the first exposure time.

6. The imaging apparatus according to claim 1, wherein, in the case where (a) a first time interval is a time interval between the center time of the exposure time for the first frame and the center time of the exposure time for the second frame, and (b) a second time interval is a time interval between the center time of the exposure time for the second frame and the center time of the exposure time for the third frame, then the difference between the first time interval and the second time interval is less than the shortest exposure time among the first exposure time, the second exposure time, and the third exposure time.

7. The imaging apparatus according to claim 1, wherein a first semiconductor layer and a second semiconductor layer are stacked in layers,
wherein photoelectric conversion elements included in the pixel circuits are disposed on the first semiconductor layer, and
wherein semiconductor elements included in the signal processing unit are disposed on the second semiconductor layer.

8. The imaging apparatus according to claim 7, wherein the semiconductor elements included in the memory are disposed on the second semiconductor layer.

9. The imaging apparatus according to claim 7, wherein a third semiconductor layer, on which the memory is disposed, is stacked on the second semiconductor layer.

10. An imaging system comprising:
the imaging apparatus according to claim 1; and
a processing unit configured to process signals outputted from the imaging apparatus.

11. A moving body comprising:
the imaging apparatus according to claim 1;
an information acquisition unit configured to acquire information from signals outputted from the imaging apparatus; and
a moving body control unit configured to control the moving body based on the information.

12. The imaging apparatus according to claim 1, wherein a time during which the memory holds the image data corresponding to the first frame and the image data corresponding to the second frame includes at least part of a time comprising (1) the third exposure time and (2) a time during which the pixel signals corresponding to the third frame are read out from the plurality of pixel circuits.

13. The imaging apparatus according to claim 1, wherein no frame is present between the first frame and the second frame, and
wherein no frame is present between the second frame and the third frame.

14. The imaging apparatus according to claim 1, wherein the pixel line which is read for the first frame and the third frame is read for the second frame.

15. The imaging apparatus according to claim 1, wherein a total number of frames to generate the first image is greater than a total number of frames to generate the second image.

16. The imaging apparatus according to claim 1 further comprising a scanning circuit configured to sequentially scan a plurality of pixel lines,
wherein the scanning circuit starts to scan in response to a control signal,
wherein the pixel signals corresponding to the first frame are read in a first reading time,
wherein the pixel signals corresponding to the second frame are read in a second reading time,
wherein the pixel signals corresponding to the third frame are read in a third reading time, and
wherein, in a case where the first reading time is included in a period from a time the scanning starts by inputting a control signal to the scanning circuit to a next time the scanning starts by inputting a control signal to the scanning circuit, the second reading time and the third reading time are not included in the period.

17. The imaging apparatus according to claim 16, wherein in a case where the third reading time is included in the period, the first reading time and the second reading time are not included in the period.

18. The imaging apparatus according to claim 17, wherein in a case where the second reading time is included in the period, the first reading time and the third reading time are not included in the period.

19. The imaging apparatus according to claim 18, wherein a control signal to start to scan for the first frame, a control signal to start to scan for the second frame, and a control signal to start to scan for the third frame are input to the scanning circuit, in this order.

20. An imaging apparatus comprising:
a plurality of pixel circuits;
a memory;
a signal processing unit configured to generate image data based on pixel signals read from the plurality of pixel circuits and store the image data in the memory; and
a computing unit configured to generate an image based on the image data,
wherein the signal processing unit reads pixel signals from the plurality of pixel circuits during a predetermined time, and stores the pixel signals in the memory as image data corresponding to one frame,
wherein the signal processing unit stores at least (1) image data corresponding to a first frame which corresponds to a first exposure time, (2) image data corresponding to a second frame which corresponds to a second exposure time that is different from the first exposure time, and (3) image data corresponding to a third frame which corresponds to a third exposure time that is different from the second exposure time,
wherein the exposure for the second frame is performed between the exposure for the first frame and the exposure for the third frame,
wherein the computing unit generates a first image using the image data corresponding to the first frame and third frame stored in the memory, and generates a second image using the image data corresponding to the second frame stored in the memory, and
wherein the reading start time of the pixel signals corresponding to the second frame from the pixel circuits is a center time between the reading start time of the pixel signals corresponding to the first frame from the pixel circuit and the reading start time of the pixel signals corresponding to the third frame from the pixel circuits.

21. An imaging apparatus comprising:
a plurality of pixel circuits;
a memory;
a signal processing unit configured to generate image data based on pixel signals read from the plurality of pixel circuits and store the image data in the memory; and
a computing unit configured to generate an image based on the image data,
wherein the signal processing unit reads pixel signals from the plurality of pixel circuits during a predetermined time, and stores the pixel signals in the memory as image data corresponding to one frame,
wherein the signal processing unit stores at least (1) image data corresponding to a first frame which corresponds to a first exposure time, (2) image data corresponding to a second frame which corresponds to a second exposure time that is different from the first exposure time, and (3) image data corresponding to a third frame which corresponds to a third exposure time that is different from the second exposure time,
wherein the exposure for the second frame is performed between the exposure for the first frame and the exposure for the third frame,
wherein the computing unit generates a first image using the image data corresponding to the first frame and third frame stored in the memory, and generates a second image using the image data corresponding to the second frame stored in the memory,
wherein each one of the plurality of pixel circuits is further configured to include at least two photoelectric conversion elements, and
wherein the signal processing unit is further configured to read charges from one of the two photoelectric conversion elements to acquire image data corresponding to the first frame and the third frame, and read charges from both of the two photoelectric conversion elements to acquire image data corresponding to the second frame.

22. The imaging apparatus according to claim 21, wherein the computing unit is further configured to detect a focal point based on the first image and the second image.

* * * * *